US012794463B2

(12) United States Patent
Mahmoodi et al.

(10) Patent No.: US 12,794,463 B2
(45) Date of Patent: Nov. 10, 2026

(54) COMPARATOR FOR HIGH SPEED INTERFACE

(71) Applicant: Sandisk Technologies, Inc., Milpitas, CA (US)

(72) Inventors: Mohammad Mahmoodi, Santa Barbara, CA (US); Zahra Fahimi, Santa Barbara, CA (US); Martin Lueker-Boden, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/747,500

(22) Filed: Jun. 19, 2024

(65) Prior Publication Data

US 2025/0392298 A1 Dec. 25, 2025

(51) Int. Cl.
*H03K 5/00* (2006.01)
*H03K 5/24* (2006.01)
*G11C 16/04* (2006.01)

(52) U.S. Cl.
CPC ........... *H03K 5/249* (2013.01); *H03K 5/2481* (2013.01); *G11C 16/0483* (2013.01)

(58) Field of Classification Search
CPC .... H03K 5/249; H03K 5/2481; H03K 5/2472; G11C 16/0483; G01R 25/005
See application file for complete search history.

(56) References Cited

U.S. PATENT DOCUMENTS

| | | | | |
|---|---|---|---|---|
| 6,559,787 B1 * | 5/2003 | Aude | H03K 5/249 341/161 |
| 8,446,994 B2 | 5/2013 | Rawlins et al. | |
| 8,922,267 B2 | 12/2014 | Peschke et al. | |
| 9,722,621 B2 | 8/2017 | Ranjbar et al. | |
| 10,763,879 B1 * | 9/2020 | Neto | H03M 1/125 |
| 11,398,811 B2 * | 7/2022 | Chang | H03K 3/023 |
| 2003/0038656 A1 * | 2/2003 | Shenai | H03K 5/249 327/78 |
| 2020/0204184 A1 | 6/2020 | Rattan | |

FOREIGN PATENT DOCUMENTS

WO WO2018/203149 A1 11/2018

OTHER PUBLICATIONS

Dutta, Sounak, "Design of a Strong-Arm Dynamic-Latch based comparator with high speed, low power and low offset for SAR-ADC," Electronics and Telecommunication, Jadavpur University, Kolkata, India, Oct. 2022, 5 pages.

* cited by examiner

*Primary Examiner* — Tuan T Lam
(74) *Attorney, Agent, or Firm* — Pearl Cohen LLP

(57) ABSTRACT

An apparatus includes a mirror circuit connected to a comparator core. The comparator core is configured to compare voltages of first and second terminals at sample times determined by a first clock signal. The mirror circuit is connected to the first and second terminals and is driven by a second clock signal that is in anti-phase with the first clock signal.

19 Claims, 17 Drawing Sheets

COMPARATOR FOR HIGH SPEED INTERFACE

BACKGROUND

The present technology relates to nonvolatile memories.

Semiconductor memory devices have become more popular for use in various electronic devices. For example, non-volatile semiconductor memory is used in cellular telephones, digital cameras, personal digital assistants, mobile computing devices, non-mobile computing devices and other devices (host devices).

A memory device includes memory cells, which may be arranged in series, in NAND strings, for instance, where select gate transistors are provided at the ends of the NAND string to selectively connect a channel of the NAND string to a source line or bit line. A charge-storing material such as a floating gate or a charge-trapping material can be used in such memory devices to store a charge which represents a data state.

A data storage system may include a memory controller die and one or more memory package, each package including one or more nonvolatile memory die. A bus between the memory controller and memory packages may allow data to be transferred to memory packages for storage and from memory packages for subsequent access. A data storage system may be connected to a host through a host interface. Interface circuits (e.g., in a memory die, memory controller, host or elsewhere) may include comparators that sample voltage differences (e.g., between two signal voltages in differential signaling) according to a clock signal. Design and operation of such comparators for high speed applications may be challenging.

BRIEF DESCRIPTION OF THE DRAWINGS

Like-numbered elements refer to common components in the different Figures (FIGS.).

DETAILED DESCRIPTION

The technology described herein includes control circuits that are configured to connect to a comparator core. For example, a mirror circuit may connect to input terminals of a comparator core (e.g., where the comparator core is configured to compare voltages at the input terminals according to a first clock signal). The mirror circuit may be driven by a second clock signal that is in anti-phase with the first clock signal so that a voltage pulse from the mirror circuit is opposite in polarity to a kickback voltage from the comparator core and tends to reduce or eliminate effects of kickback in the comparator core.

In an example, multiple offset clock signals are used to drive switches of a comparator. For example, in addition to a first clock signal used to establish sample times, first and second offset clock signals may be generated and may be applied to different precharge switches of the comparator core, which may affect precharge times of different branches of the comparator core. A calibration operation may be performed to find offsets for the first and second clock signals so that input referred offset is substantially reduced or eliminated.

Aspects of the present technology provide technical solutions to technical problems associated with design and operation of comparators (e.g., as used in interfaces for digital communication) including kickback noise and input referred offset. Technical solutions include using mirror circuits to reduce or eliminate kickback noise in a comparator and/or use offset clock signals to reduce or eliminate input referred offset in a comparator.

Figure 1A:
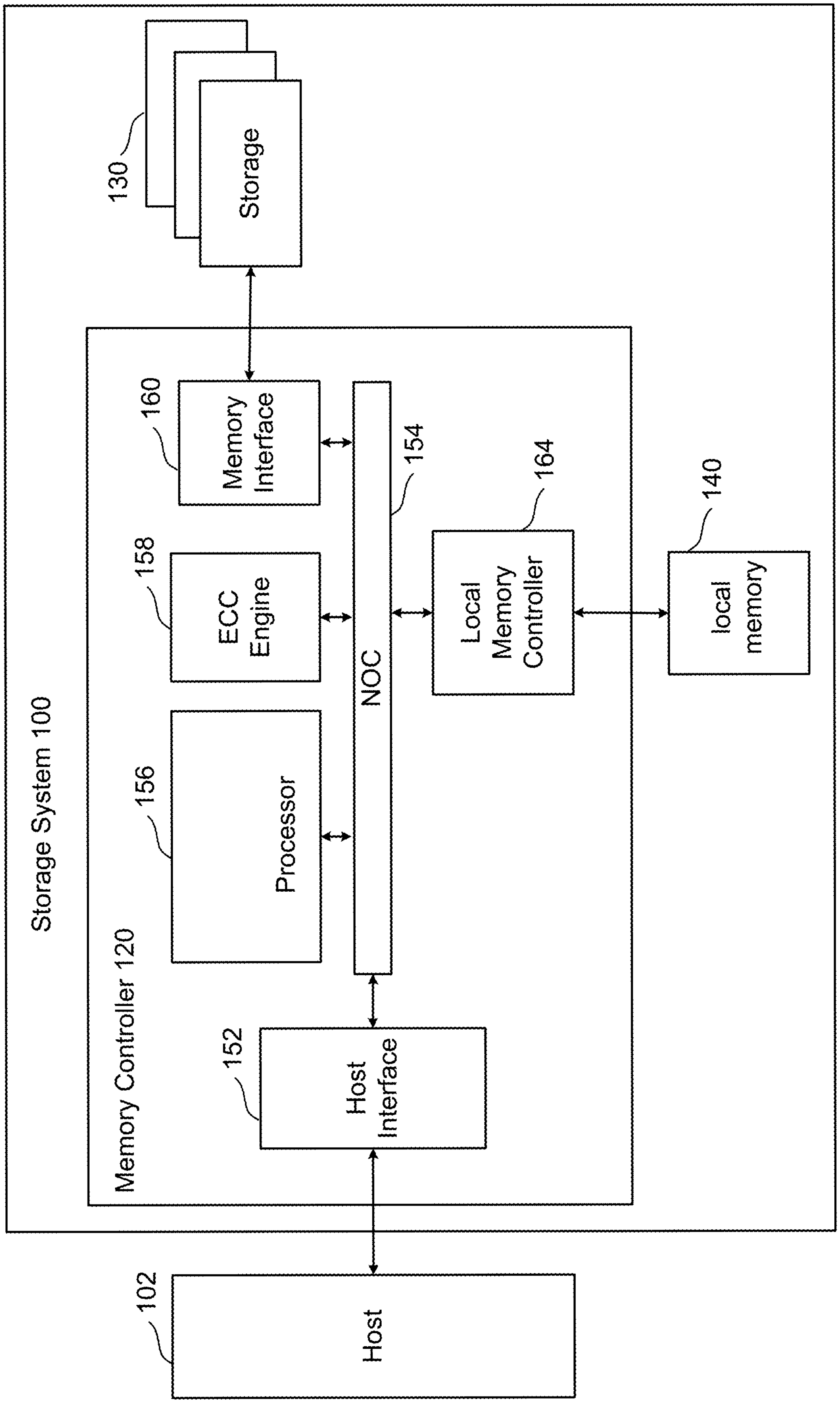
FIG. 1A is a block diagram of one embodiment of a storage system connected to a host.

FIG. 1A is a block diagram of one embodiment of a data storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1A are electrical circuits. Storage system 100 includes a memory controller 120 (or storage controller) connected to memory package 130 and local high speed memory 140 (e.g., DRAM, SRAM, MRAM). Local high speed memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus.

Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word “tables” they need not literally be tables. Rather, the logical address to physical address tables (or L2P tables) can be any type of data structure.

Memory interface 160 communicates with memory packages 130. In one embodiment, memory interface provides a Toggle Mode interface. Other interfaces can also be used. In some example implementations, memory interface 160 (or another portion of memory controller 120) implements a scheduler and buffer for transmitting data to and receiving data from one or more memory die.

Figure 1B:
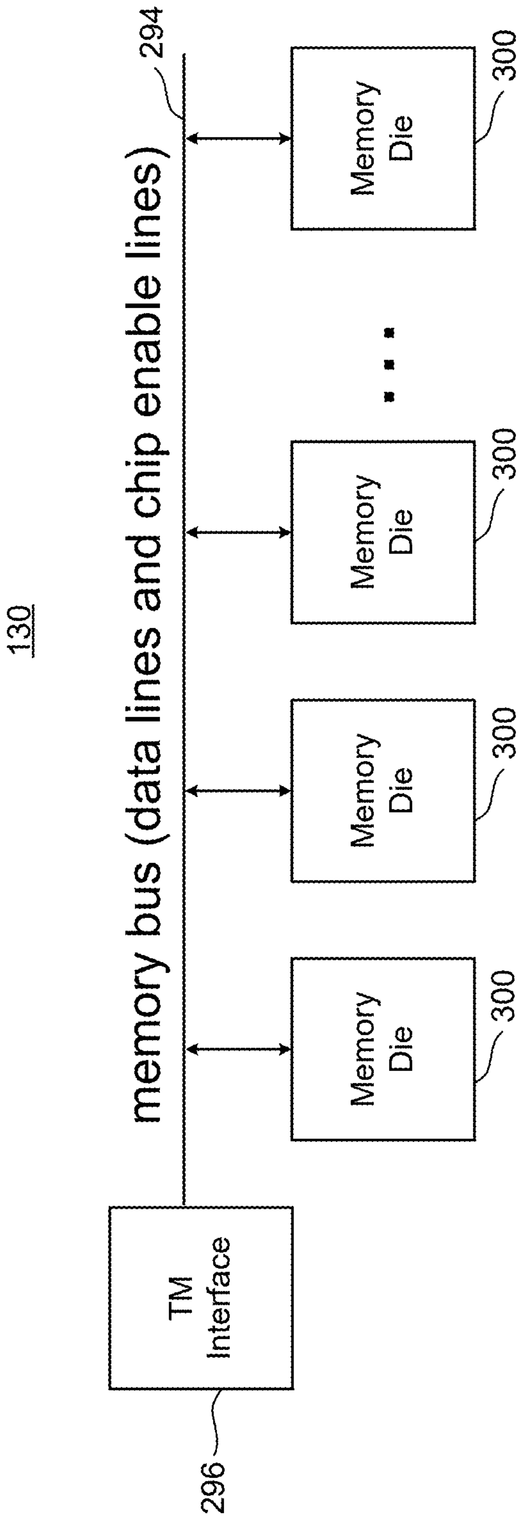
FIG. 1B is a block diagram of one embodiment of a memory package.

FIG. 1B is a block diagram of one embodiment of a memory package 130 that includes a plurality of memory die 300 connected to a memory bus 294 (data lines and chip enable lines). The memory bus 294 connects to a Toggle Mode Interface 296 for communicating with the memory interface of a memory controller (e.g., memory interface 160). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die. In some cases, a TM interface may be implemented in a memory die (e.g., one or more of memory dies 300). In some cases, a TM interface may be implemented in a control die that is coupled to (e.g., directly bonded to) a memory die.

Figure 2A:
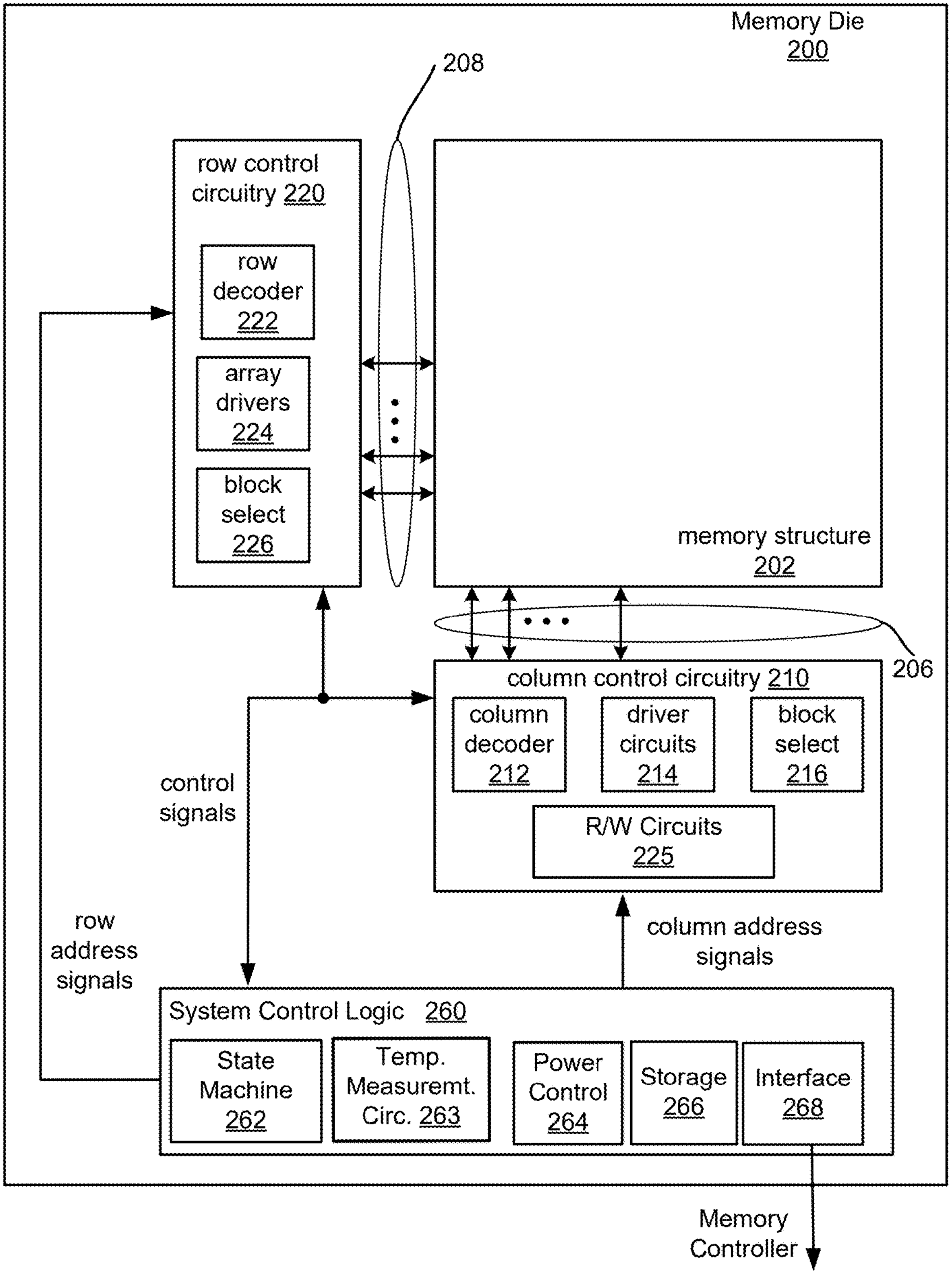
FIG. 2A is a functional block diagram of an embodiment of a memory die.

In one embodiment, a memory package 130 comprises one or more memory dies. FIG. 2A is a functional block diagram of one embodiment of a memory die 200 that comprises non-volatile storage. Each of the one or more memory dies of memory package 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic 260, and typically may include such circuits as row decoders 222, array drivers 224, and block select circuit 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for memory structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuit 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202. Temperature measurement circuit 263 may generate temperature measurement values from temperature sensing by one or more temperature transducers located in memory die 200.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
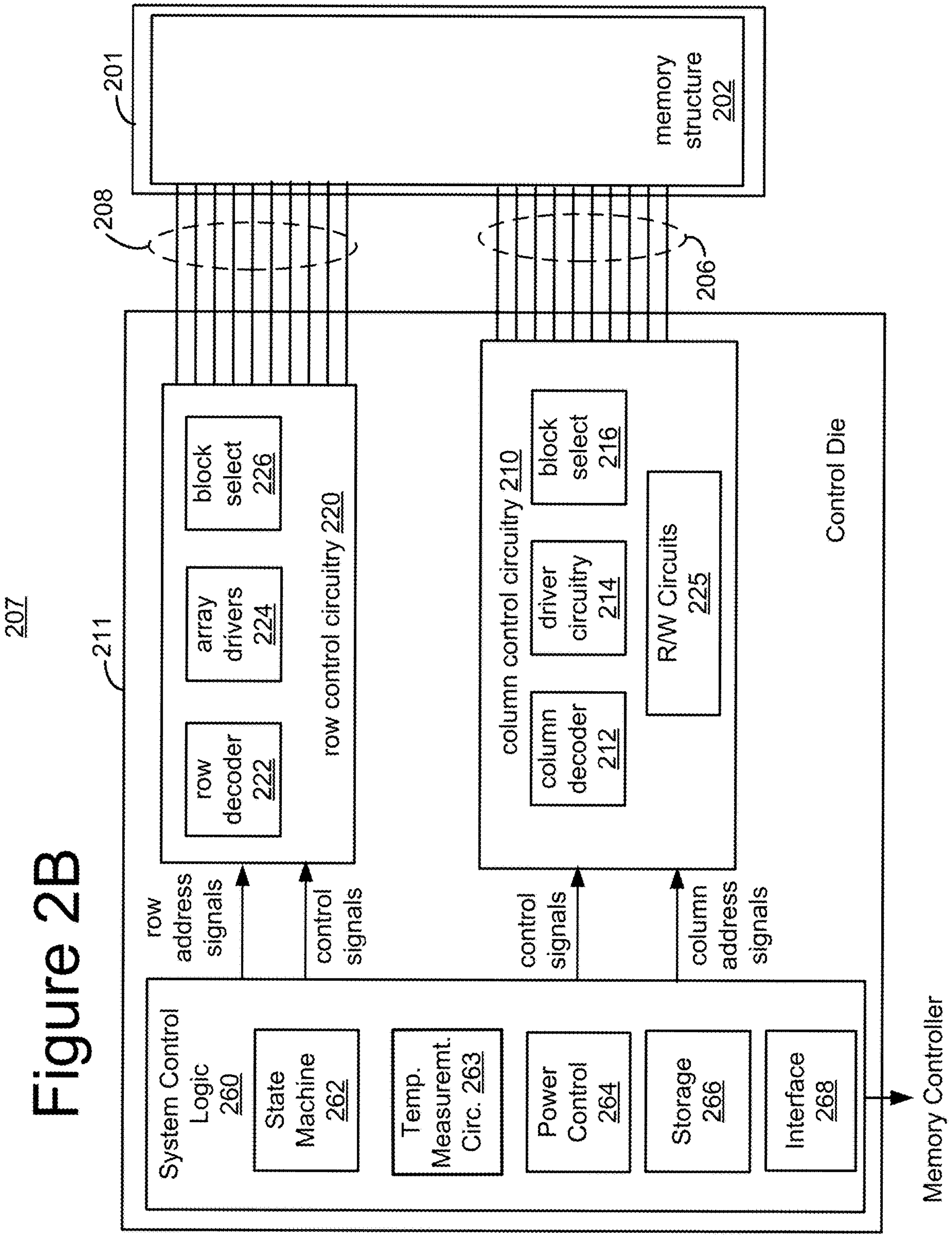
FIG. 2B is a functional block diagram of an embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement memory package 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes system control logic 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate memory controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuits 214, and block select circuit 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select circuit 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control module 264, all or a portion of system control logic 260, all or a portion of row control circuitry 220, all or a portion of column control circuitry 210, read/write circuits 225, interface 268, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, memory package 130, memory die 200, integrated memory assembly 207, and/or control die 211.

Figure 3:
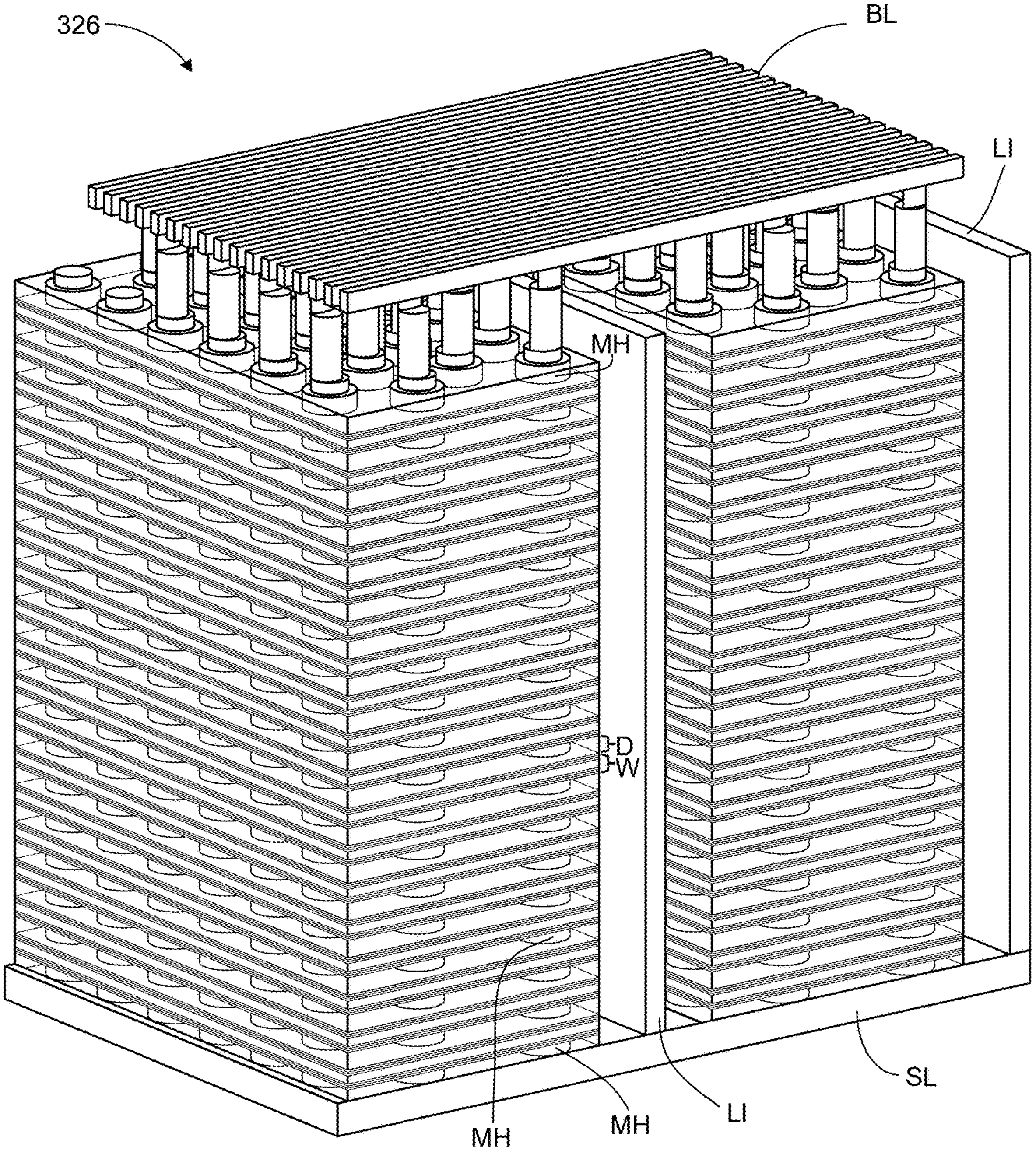
FIG. 3 is a perspective view of a portion of one embodiment of a monolithic three-dimensional memory structure.

FIG. 3 is a perspective view of a portion of one example embodiment of a monolithic three-dimensional nonvolatile memory array that can comprise memory structure 202, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-278 alternating dielectric layers and conductive layers, for example, 127 data word line layers, 8 select layers, 4 dummy word line layers and 139 dielectric layers. More or fewer than 108-278 layers can also be used.

The alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

Figure 4:
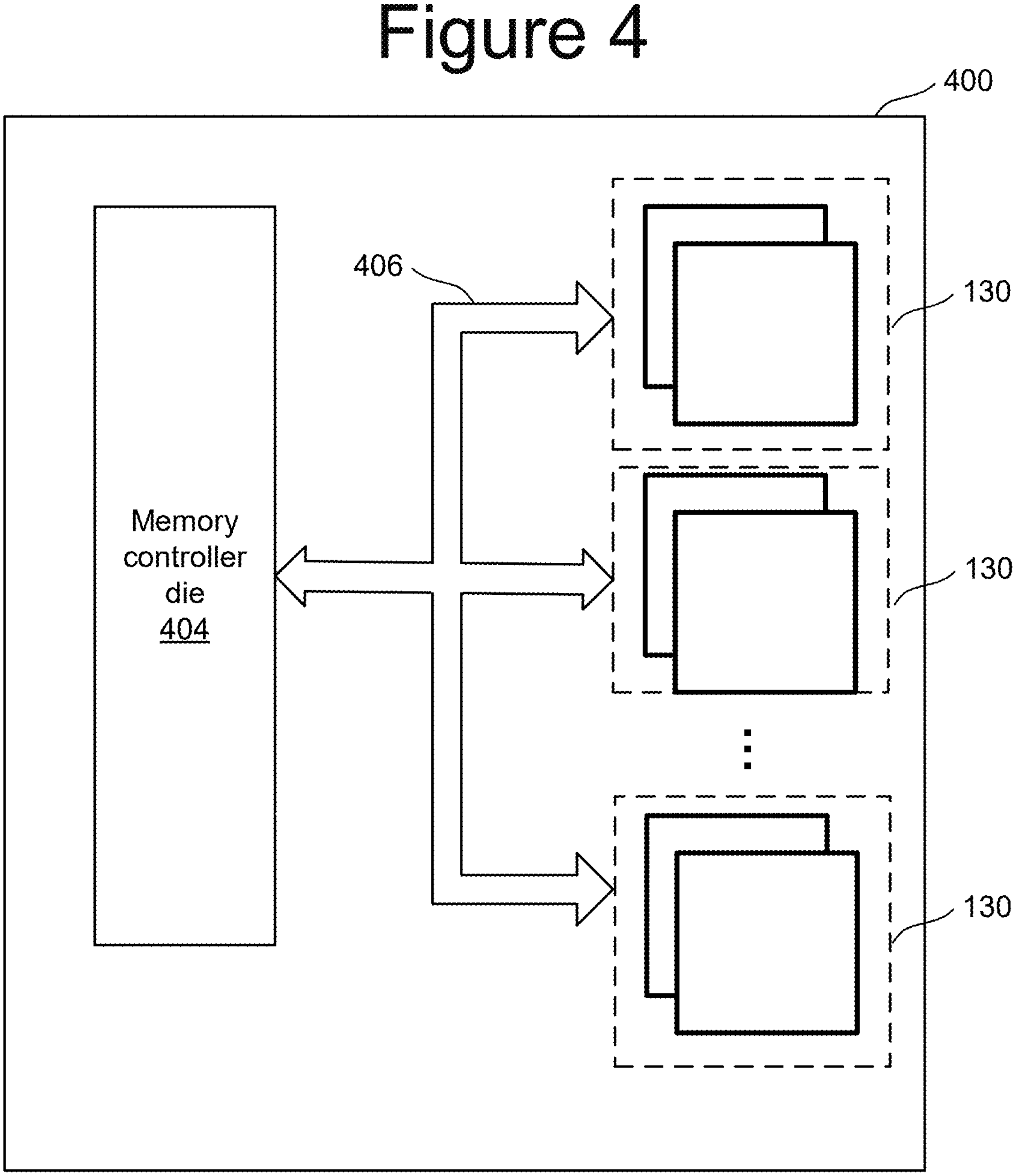
FIG. 4 shows an example of a data storage system that includes a memory controller die connected to memory packages.

FIG. 4 shows an example of a data storage system 400 that includes a memory controller die 404 (e.g., memory controller 120 formed on memory controller die 404) connected to three memory packages 130 by a bus 406. Each memory package 130 may include one or more memory die (e.g., a single memory die 200 as illustrated in FIG. 2A or multiple memory dies, for example, stacked or otherwise arranged) or may include one or more integrated memory assembly (e.g., integrated memory assembly 207, including control die 211 and memory structure die 201). Bus 406 connects memory controller die 404 with memory packages 130 to enable transfer of data from memory controller die 404 to a selected memory package.

Communication over bus 406 may be digital communication that uses data signals (e.g., DQ) and clock signals (e.g., DQS), which may follow an interface protocol (e.g., TM800). High speed digital communication over such a bus may be challenging for a number of reasons. In some cases, Input/Output (I/O) circuits connected to a bus such as bus 406 may generate errors. For example, I/O circuits may receive a bit that is sent over a bus (e.g., logic 0) and mistakenly output a different bit (e.g., logic 1). In some cases, errors may be caused by comparators used in I/O circuits. In order to maintain a low error rate (e.g., low Bit Error Rate or "BER") some calibration of I/O circuits may be performed (e.g., ZQ calibration). In some cases, errors in ZQ calibration may be caused by comparators, which may result in errors.

Aspects of the present technology are directed to comparators, including circuits used to form comparators and operation of comparators in ways that may result in low error rates. For example, aspects of the present technology may reduce comparator-related problems such as kickback current and/or input referred offset, which may enable lower error rates. Aspects of the present technology provide technical solutions, including specific circuits and methods of operating circuits, to technical problems of operating comparators in a variety of applications (including, but not limited to, I/O circuits in data storage systems and other systems).

Figure 5:
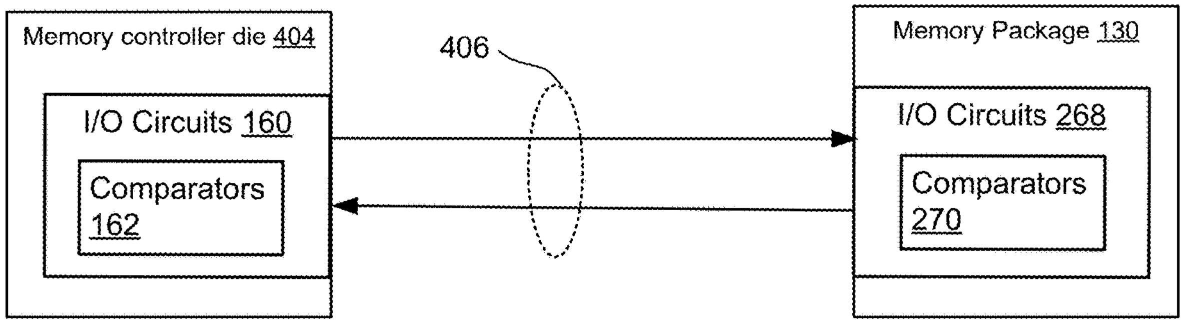
FIG. 5 shows an example of I/O circuits that include comparators.

FIG. 5 illustrates an example of I/O circuits on either side of bus 406. I/O circuits 160 of memory controller die 404 includes comparators 162 and I/O circuits 268 include comparators 270. Comparators may be used, for example, to receive digital communication that is sent using differential signaling (e.g., by sensing voltage difference between two conductors (wires or leads) at sampling times that may be determined by a clock signal. While FIG. 5 shows an example of comparators in a particular application, comparators may be used in a variety of other applications including I/O circuits and in circuits other than I/O circuits. The present technology is not limited to any particular application or applications.

Figure 6A:
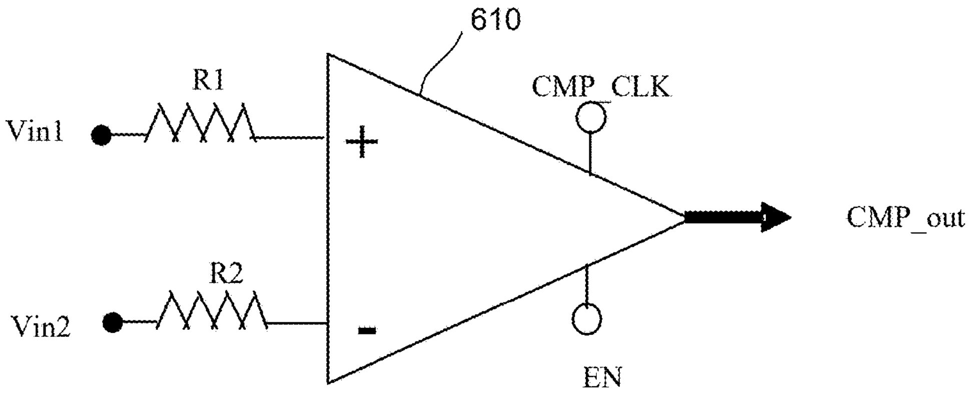
FIGS. 6A-C show an example of a comparator.

FIG. 6A shows a schematic illustration of a comparator 610 that compares voltages at its input terminals (a positive terminal marked "+" and a negative terminal marked "−") and generates an output "CMP_out" according to the comparison (e.g., outputting logic 0 if the voltage at the positive terminal, Vin1, is greater than the voltage at the negative terminal, Vin2, and outputting logic 1 if the voltage at the negative terminal, Vin2, is greater than the voltage at the positive terminal, Vin1). Comparator 610 may sample input voltages Vin1 and Vin2 at sample times determined by a comparator clock signal "CMP_CLK" when comparator 610 is enabled by an enable signal "EN." FIG. 6A also shows a first resistance, R1, and a second resistance, R2, connected to the positive and negative terminals respectively. Resistances R1 and R2 represent resistances of a previous stage and/or between stages. In some cases, these resistances may be different (e.g., due to different lines having different resistances).

Figure 6B:
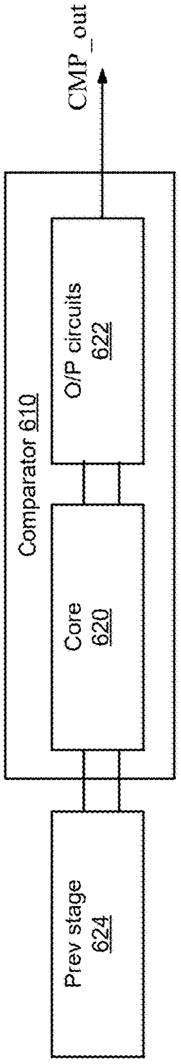

FIG. 6B shows a schematic illustration of comparator 610, including comparator core 620, which may perform comparison operations, and output (O/P) circuits 622, which may include inverter loads and latches for protecting data output from comparator core 620 (e.g., comparison data) and for generating an output, CMP_out. FIG. 6B also shows previous stage 624, which may affect operation of comparator 610 in some cases.

Figure 6C:
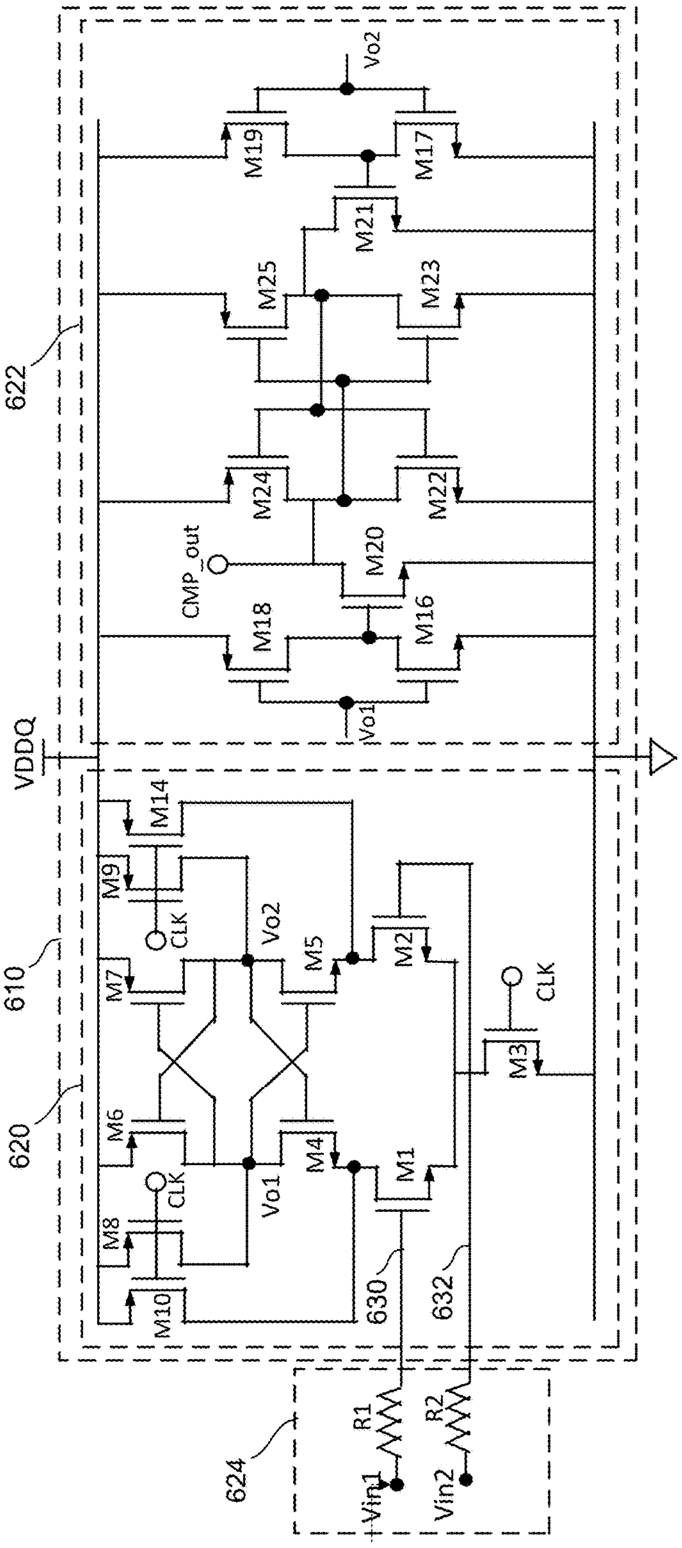

FIG. 6C shows an example implementation of comparator core 620 and output circuits 622. Previous stage 624 provides two voltages Vin1 and Vin2, with respective resistances R1 and R2, to input terminals 630 and 632 of core 620. Positive input terminal 630 is connected to the gate of a first switch, M1, and negative input terminal 632 is connected to the gate of a second switch, M2. Switches, M1 and M2, are connected to form a differential pair. A third switch, M3, is connected to switches M1 and M2 and has a gate connected to a clock signal, CLK. In this configuration, switches M1 and M2 sample voltages at input terminals 630 and 632 at sample times determined by CLK. The switches M1 and M2 are sampled according to clock signal CLK applied to M3 in this configuration may be considered a clocked differential pair. Switches M4 and M5 form a first cross-coupled pair while switches M6 and M7 form a second cross-coupled pair. Switches M8, M9, M10 and M14 are precharge switches that are all driven by clock signal, CLK. The arrangement of core 620 may be referred to as a Strong-ARM core. Output voltages, Vo1 and Vo2, of core 620 are provided to output circuits 622 (connections omitted for clarity). While switches in the present schematic illustrations are implemented by PMOS and NMOS transistors, switches may be implemented using any suitable components (including different types of transistors) and are not limited to the examples shown.

Output circuits 622 receives voltages Vo1 and Vo2 at left and right sides of the schematic shown. Voltage Vo1 is connected to gates of switches M16 and M18, which are connected in series. The gate of transistor M20 is connected between M16 and M18. Switch M20 is connected to an output terminal that provides output signal CMP_out. Voltage Vo2 is connected to gates of switches M17 and M19, which are connected in series. The gate of switch M21 is connected between M17 and M19. Switch M21 is connected to series-connected switches M23 and M25, which are coupled to series-connected switches M22 and M24. CMP_out is connected between switches M22 and M24.

Previous stage 624 is illustrated in a simplified manner as two resistances, R1 and R2, connected to input terminals 630 and 632. Some effects of a previous stage on the operation of comparator 610 may be understood with reference to resistances R1 and R2. In some cases, a comparator such as comparator 610 may be affected by kickback noise. Kickback noise may occur when voltage variation at internal nodes of a comparator are coupled to input terminals (e.g., input terminals 630 and 632), which may affect comparator operation. Kickback noise may be exacerbated by different resistances of different inputs (e.g., differences between R1 and R2) which may generate a voltage difference at the input terminals (e.g., causing a voltage difference between input terminals 630 and 632). Such a voltage difference may cause an erroneous reading by a comparator. For example, a logic 0 from previous stage 624 may be sensed as a logic 1 at input terminals 630 and 632 or a logic 1 from previous stage 624 may be sensed as a logic 0 at input terminals 630 and 632.

Figure 7A:
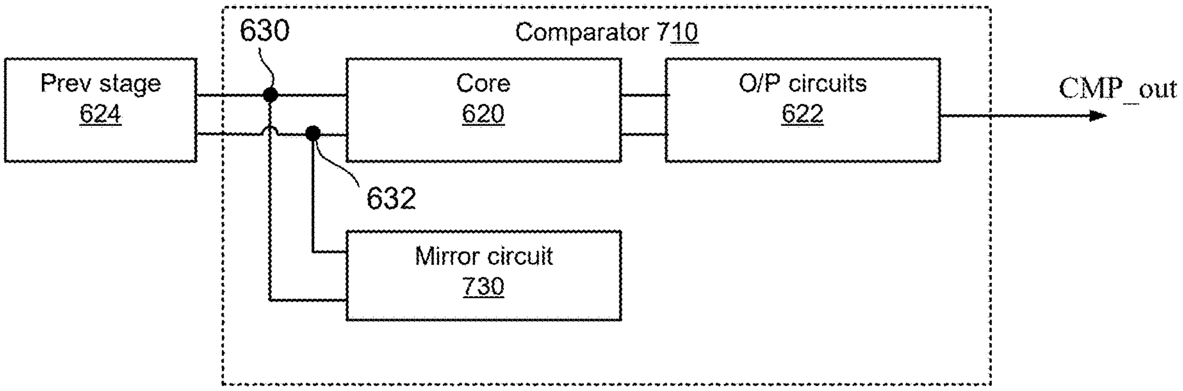
FIGS. 7A-C show an example of a comparator with a mirror circuit.

Aspects of the present technology provide solutions to manage kickback noise that may affect a comparator. FIG. 7A shows an example of a comparator 710 that includes comparator core ("core") 620 and output circuits 622 as before and in addition includes mirror circuit 730, which is connected to input terminals 630 and 632. Mirror circuit 730 may be formed of components that correspond to ("mirror") certain components of core 620 so that their characteristics may be similar in some respects. In an example, mirror circuit 730 is arranged to provide a kickback that is similar to the kickback from core 620 but is opposite in polarity so that the kickback from mirror circuit 730 tends to cancel out the kickback from core 620 and thus reduce or eliminate kickback noise effects that might otherwise cause incorrect sensing (e.g., bad bits).

Figure 7B:
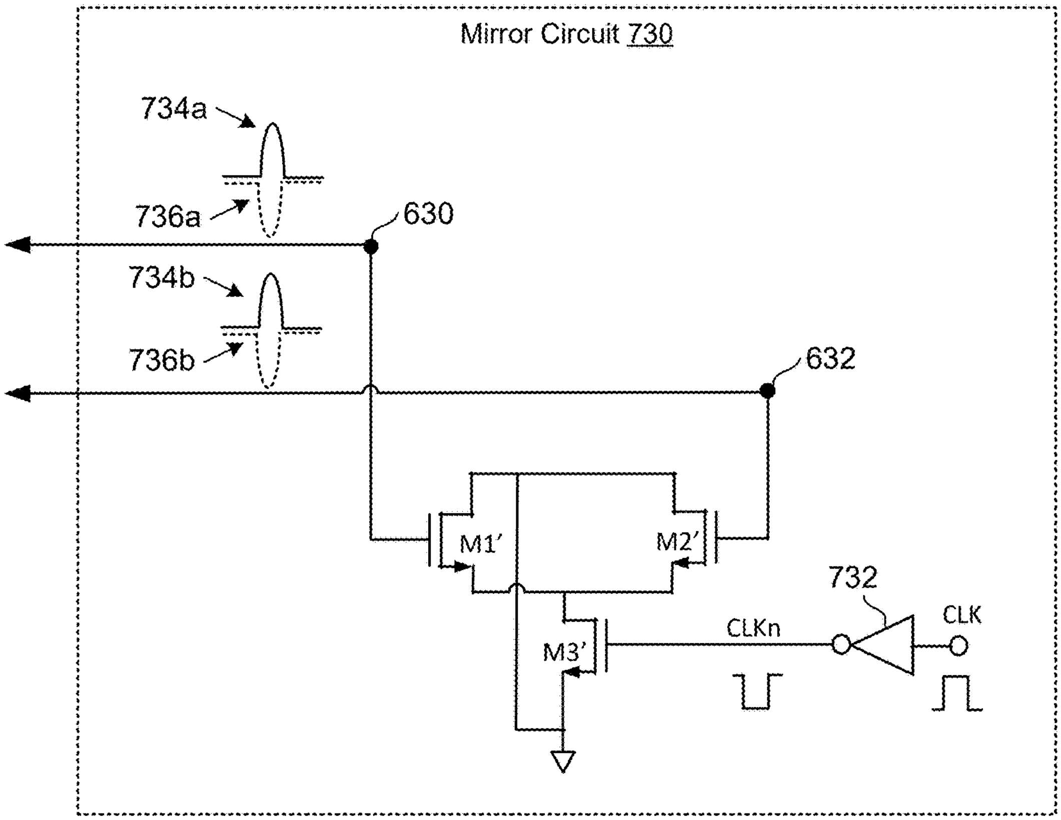

FIG. 7B shows an example implementation of mirror circuit 730. Mirror circuit 730 includes a first mirror transistor, M1', a second mirror transistor M2' and a third mirror transistor M3' which are connected to form a clocked differential pair (similar to clocked differential pair formed by M1, M2 and M3), which is connected to ground at both top and bottom. For example, the drains of M1' and M2' are connected to ground and the source of M3' is connected to ground. The drain of M3' is connected to sources of M1' and M2'. The gate of M3' is controlled by a clock signal, CLKn (second clock signal), that is in anti-phase with clock signal CLK (first clock signal). For example, CLKn may be 180 degrees out of phase with CLK and may be generated by inverting CLK. For example, mirror circuit 730 includes inverter 732 to generate CLKn from CLK (in other examples, CLKn may be generated outside of a mirror circuit). The gates of M1' and M2' are connected to input terminals 630 and 632. In this configuration, mirror circuit 730 may generate kickback voltages at input terminals 630 and 632.

FIG. 7B shows first kickback voltages 734*a* and 734*b* (e.g., positive voltage pulses) at input terminals 630 and 632 respectively, which are generated by a comparator core (e.g., from M1 and M2 of core 620). In addition, FIG. 7B shows second kickback voltages 736*a* and 736*b* (e.g., negative voltage pulses), which are generated by mirror circuit 730 (e.g., from M1' and M2'). Because second kickback voltage pulses 736*a* and 736*b* are of opposite polarity to kickback voltage pulses 734*a* and 734*b*, they tend to cancel out kickback voltage pulses 734*a* and 734*b* (e.g., the combined voltage may be a small voltage pulse or a substantially stable voltage) and thus reduce or eliminate kickback effects on core 620 (e.g., reducing the BER in output data at CMP_out). Mirror circuit 730 may be considered an example of means for generating voltage pulses at first and second terminals (e.g., input terminals 630 and 632) according to a second clock signal that is in anti-phase with the first clock signal (e.g., CLKn in antiphase with CLK) such that the voltage pulses are opposite in polarity to kickback pulses of the comparator core (e.g., voltage pulses 736*a-b* are negative while kickback pulses from core 620 are positive).

Figure 7C:
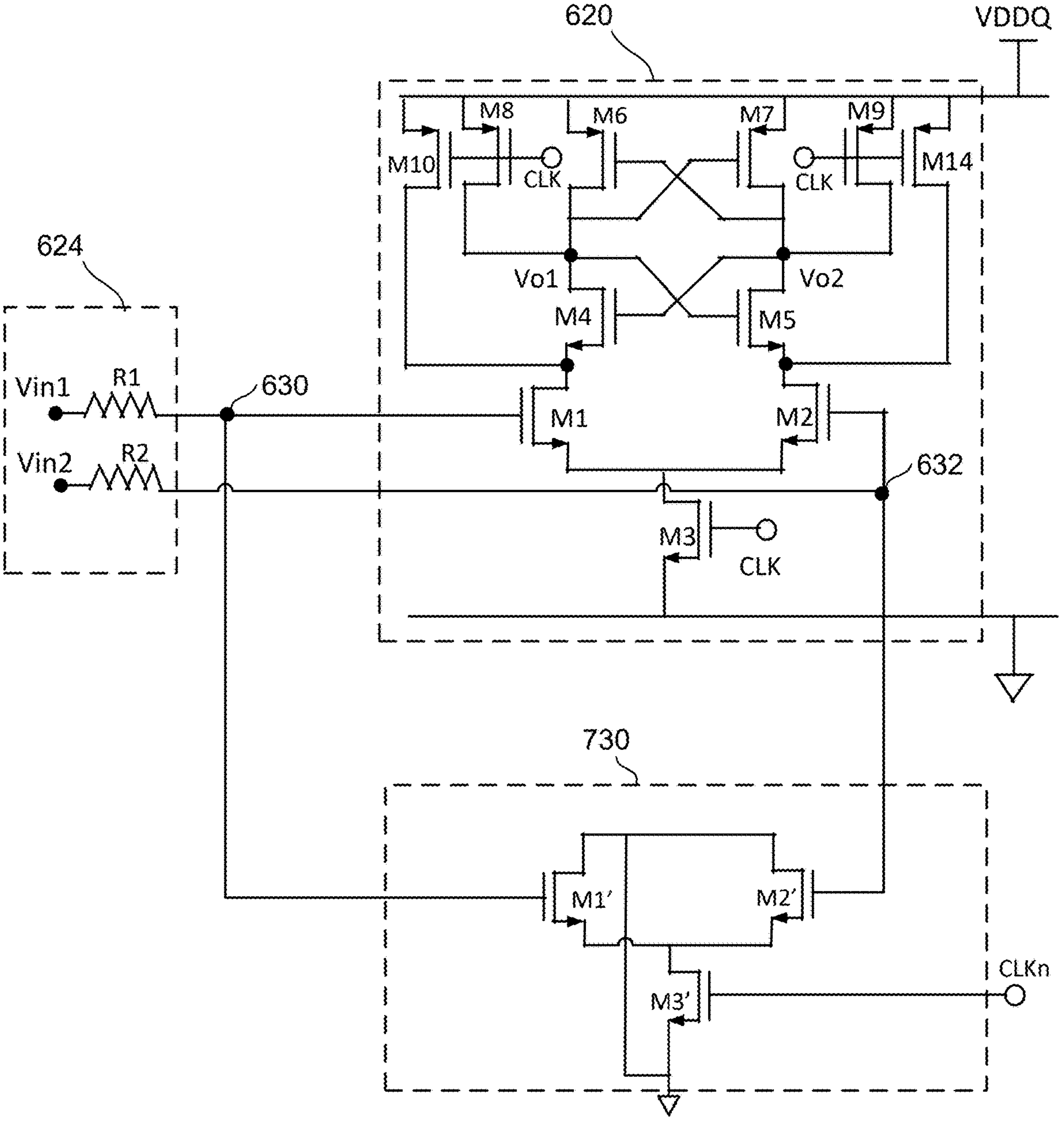

FIG. 7C illustrates an example of mirror circuit 730 connected to input terminals 630 and 632 of core 620. Mirror circuit 730 mirrors the clocked differential pair formed by M1, M2 and M3. Gates of M1 and M1' are both connected to input terminal 630. Gates of M2 and M2' are both connected to input terminal 632. M3 is driven by clock signal CLK while M3' is driven by CLKn, which is in anti-phase with CLK.

In some cases, M1' may be identical to M1, M2' may be identical to M2 and M3' may be identical to M3. In other examples, one or more of M1', M2' and M3' may differ from M1, M2 and M3. For example, while M1 may be identical M2 to form a differential pair and M1' may be identical to M2' to form another differential pair, M1 and M1' may not be identical and M2 and M2' may not be identical. For example, one or more dimensions of M1' and M2' may be different to corresponding dimensions of M1 and M2 (e.g., gate width may be different).

In some cases, a comparator may have nonzero input referred offset. For example, instead of changing its output when the difference between input voltages is zero volts, a comparator may change at some voltage that is offset from zero. Such an offset may increase the number of errors in data output by the comparator. In some cases, offset compensation may be used to ensure that the output of a comparator changes at or near zero volts.

In an example of the present technology, a clock signal is used to generate one or more offset clock signals with time offsets from the clock signal and these offset clock signals may be used in a comparator to ensure that the output of the comparator switches when input voltage difference is at or near zero volts (e.g., less than 1 millivolt, less than 100 microvolts, less than 10 microvolts, less than 1 microvolt or less than some other maximum difference).

Figure 8A:
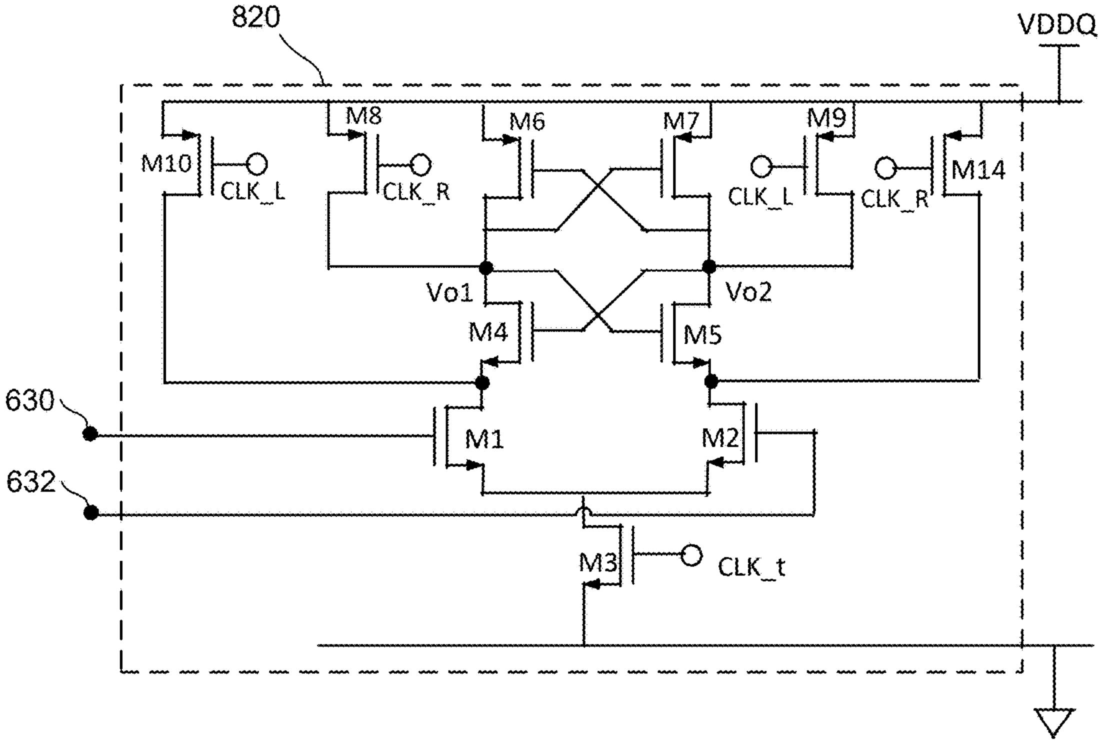
FIGS. 8A-C show an example of a comparator using multiple clock signals.

FIG. 8A illustrates an example of a comparator core 820 (Strong-ARM comparator core) that includes a clocked differential pair formed by M1, M2 and M3, a first cross-coupled pair formed of M4 and M5, a second cross-coupled pair formed of M6 and M7 and four precharge switches M8, M9, M10 and M14 as previously described with respect to comparator core 620. Unlike comparator core 620, which uses the same clock signal, CLK, to determine sample times (CLK provided to the gate of M3) and to activate precharge switches M8, M9, M10 and M14, comparator core 820 uses two different offset clock signals to activate precharge switches. For example, a first offset clock signal, CLK_L, is coupled to precharge switches M10 and M9 while a second offset clock signal, CLK_R, is coupled to precharge switches M8 and M14 and CLK_t is coupled to M3. Offset clock signals, CLK_L and CLK_R, may be offset by from CLK_t by predetermined offsets (e.g., offsets found from testing).

In some cases, input referred offset may be caused by differences between devices of different branches in a comparator core (e.g., due to processing differences during fabrication), which may affect charging and discharging. Appropriate offset clock signals may counteract any such differences to bring input offset to zero or close to zero.

Figure 8B:
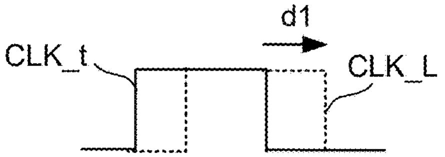
Figure 8C:
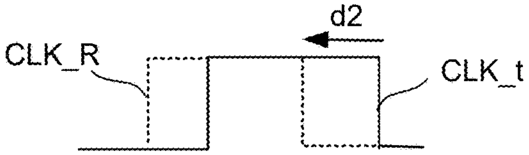

FIGS. 8B and 8C show examples of offset clock signals (dotted lines) with respect to clock signal CLK_t (shown by solid line). FIG. 8B shows first offset clock signal, CLK_L (dotted line), which is offset from CLK_t by offset d1 (e.g., a time delay applied to rising and falling edges of CLK). FIG. 8C shows second offset clock signal, CLK_R (dotted line), which is offset from CLK_t by offset-d2 (e.g., negative time offset applied to rising and falling edges of CLK). While first clock signal, CLK_L, is shown having a positive offset and second clock signal, CLK_R, is shown having a negative offset, each offset may be selected separately and each may be positive or negative and may have any suitable magnitude.

Figure 9B:
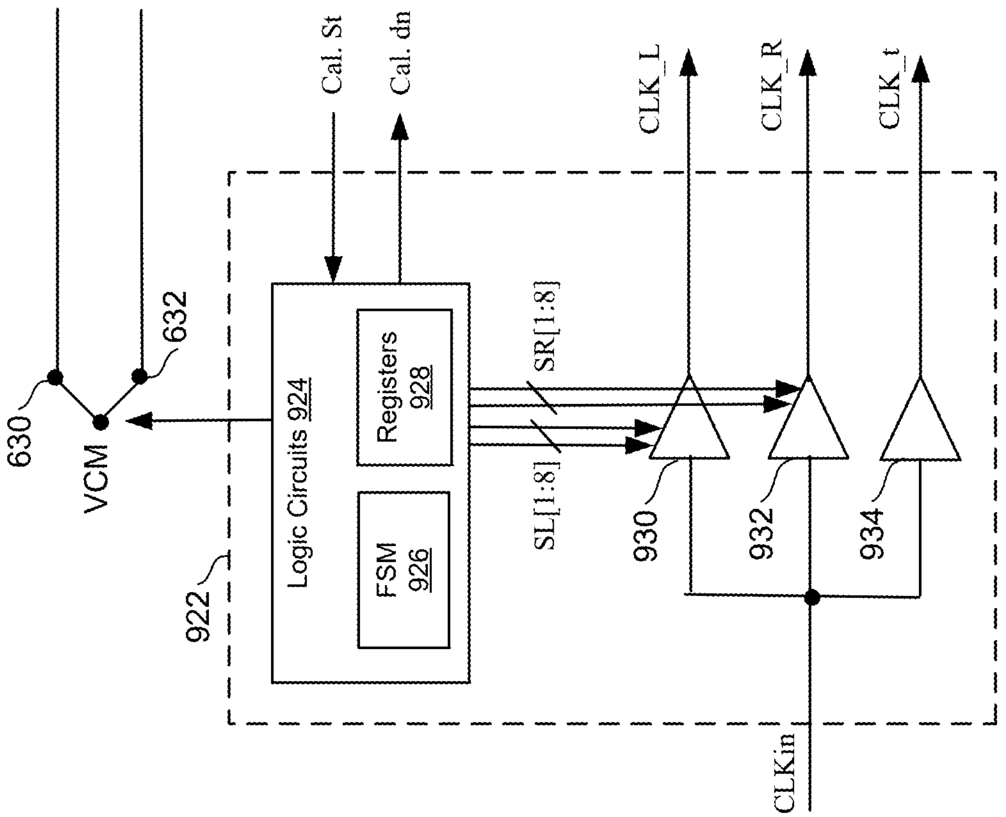
FIGS. 9A-D illustrate aspects of offset compensation circuits.
Figure 9A:
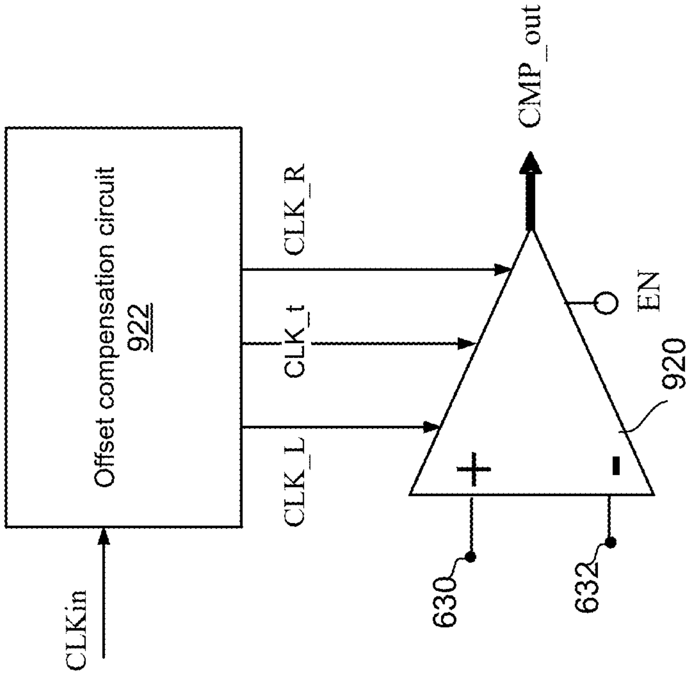
Figure 9C:
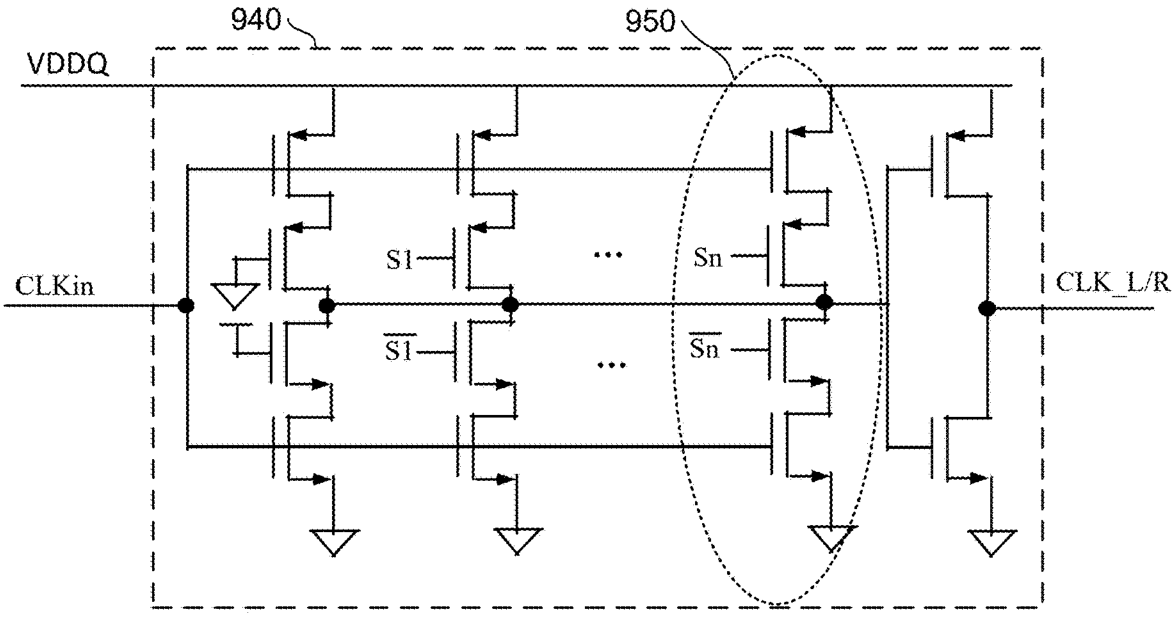

FIGS. 9A-C illustrate an example of circuits that may be used to implement aspects of the present technology. For example, FIG. 9A shows an example that includes a comparator 920 (e.g., a comparator that includes comparator core 820), which receives three clock signals, CLK_L, CLK_t and CLK_R from offset compensation circuit 922. Offset compensation circuit 922 receives an input clock signal, CLKin, and generates CLK_L, CLK_t and CLK_R with appropriate offsets. Offset compensation circuit 922 may also perform calibration to obtain values for different offsets (e.g., a first offset between CLK_t and CLK_L and a second offset between CLK_t and CLK_R).

FIG. 9B shows an example implementation of offset compensation circuit 922 of FIG. 9A. Offset compensation circuit 922 is configured to control input terminals 630 and 632. For example, during a calibration operation to find offsets for first and second offset clock signals, CLK_L and CLK_R, the voltage difference between input terminals 630 and 632 may be set to zero by connecting input terminals 630 and 632 to a common voltage (e.g., common mode voltage VCM).

Offset compensation circuit 922 includes a first delay element 930, used to apply a first delay or time offset with respect to CLKin, a second delay element 932, used to apply a second delay or time offset with respect to CLKin and a third delay element 934, used to apply a third delay or time offset with respect to CLKin. In an example, third delay element 934 applies a fixed delay with respect to CLKin while first delay element 930 and second delay element 932 apply variable delays with respect to CLKin, which may be greater or less than the delay applied to generate CLK_t. This enables offset clock signals CLK_L and CLK_R to have a negative offset with respect to CLK_t (e.g., as shown in FIG. 8C) or a positive offset with respect to CLK_t (e.g., as shown in FIG. 8B).

Delays applied by first and second delay elements 930 and 932 may be configured by inputs SL and SR respectively (using an eight bit input for each delay element in this example). During a calibration operation, the delay applied by one or both of first delay element 930 and/or second delay element 932 may be changed to test different delays while the comparator output (e.g., CMP_out) is monitored. For example, with input terminals 630 and 632 at the same voltage, the output should consist of equal numbers of logic 0 bits and logic 1 bits. When an input referred offset is present, this is not the case (e.g., >50% logic 1 and <50% logic 0 or vice versa). Different delays may be tested to find a delay or delays that result in about 50% logic 1 and 50% logic 0 (e.g., less than 5% difference, less than 2% difference, less than 1% difference or less than some other maximum percentage difference between logic 1 bits and logic 0 bits).

In an example of a calibration operation, a calibration start signal "Cal. St" is received by logic circuits 924 of offset compensation circuit 922 and in response, input terminals 630 and 632 are connected together. Finite State Machine (FSM) 926 initiates calibration by setting registers 928 to predetermined values, which are output as SL and SR to first delay element 930 and second delay element 932 respectively. For example, registers 928 may include eight bits for configuring first delay element 930 and eight bits for configuring second delay element 932. For every offset applied, FSM 926 may sample output CMP_out and check the distribution of bits (e.g., percentages of logic 0 and 1 bits). This may continue until all offsets in a test pattern or list are tested or until a suitable offset (or offsets) are found that give an acceptable distribution of output bits. When appropriate offsets are found (calibrated values), a calibration done "Cal. Dn" signal is sent and the register bits corresponding to the calibrated values are entered in registers 928. Subsequently, delays applied by first delay element 930 and second delay element 932 are set by the calibrated values in registers 928 so that input referred offset is reduced.

Delay elements 930, 932 and 934 may be implemented by any suitable circuits. FIG. 9C shows an example of a variable delay circuit 940 that may be used to provide a variable delay according to an n-bit (e.g., eight bit) configurable input. For example, variable delay circuit 940 may be used to implement first delay element 930 and/or second delay element 932 (third delay element 934 provides a fixed delay and may be configured similarly or may use a non-configurable delay circuit).

Variable delay circuit 940 includes n branches that extend in parallel between a supply voltage VDDQ and ground. For example, nth branch 950 is shown and is driven by a bit, Sn, of an n-bit input (e.g., 8th bit of SL[1:8] or SR[1:8]). Other branches are similarly enabled/disabled by corresponding bits of the n-bit input. By changing the number of branches that are enabled, the resistance between the input, CLKin, and the output, CLK_L/R, can be changed and as a result the RC delay between CLKin and an output CLK_L/R (e.g., CLK_L or CLK_R) may be changed. A range of different delays/offsets may be applied by variable delay circuit 940 by setting bits S1 to Sn to different values.

Figure 9D:
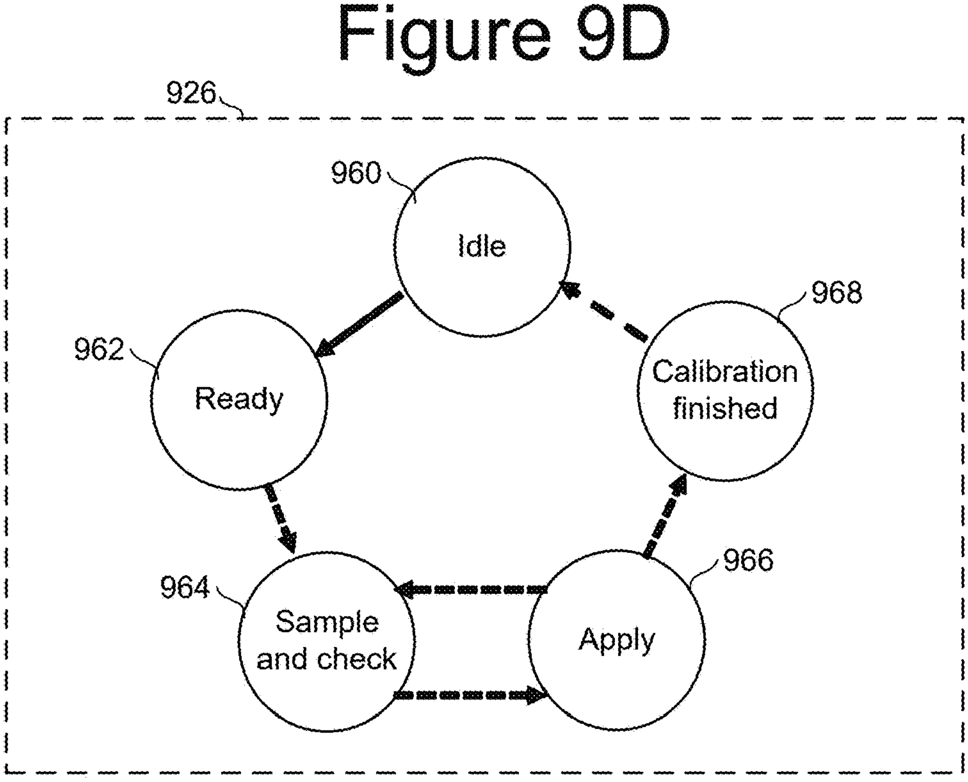

FIG. 9D shows an example implementation of FSM 926. FIG. 9D shows five states including an idle state 960. FSM 926 may wait in idle state 960 for a calibration command. FSM 926 transitions from idle state 960 to ready state 962 in response to a calibration start (Cal. St.) command. In the ready state 962, input terminals may be connected to a common-voltage (e.g., VCM) and a delay may be applied to allow voltages to settle. Subsequently, FSM 926 transitions automatically to sample and check state 964 in which FSM 926 may perform a simple optimization search starting from the MSB bit in registers 928 to find calibration values (e.g., incrementing the delay at each step and checking the comparator's output for distribution of logic 1/0 bits). FSM 926 may transition between sample and check state 964 and apply state 966. In the apply state 966, FSM 926 waits for the comparator to provide a new output based on the new offset produced by new bits. When suitable offsets (calibrated values) are found, the calibrated values are stored (e.g., in registers 928) and FSM 926 transitions to the calibration finished state 968 in which calibration-done ("cal. Dn.") signal is output, input terminals 630 and 632 are disconnected from each other and reconnected to the previous stage. Subsequently, FSM 926 transitions to idle state 960.

In some cases, a calibration operation (e.g., as illustrated in FIG. 9D may be triggered during an initialization routine (e.g., when powering up). In some cases, a calibration operation may be triggered by other triggering events (e.g., during use, without losing power). For example, calibration may be triggered by a change in temperature, fluctuation in supply voltage, elapsed time since last calibration, high error rates and/or other triggering events.

Figure 10:
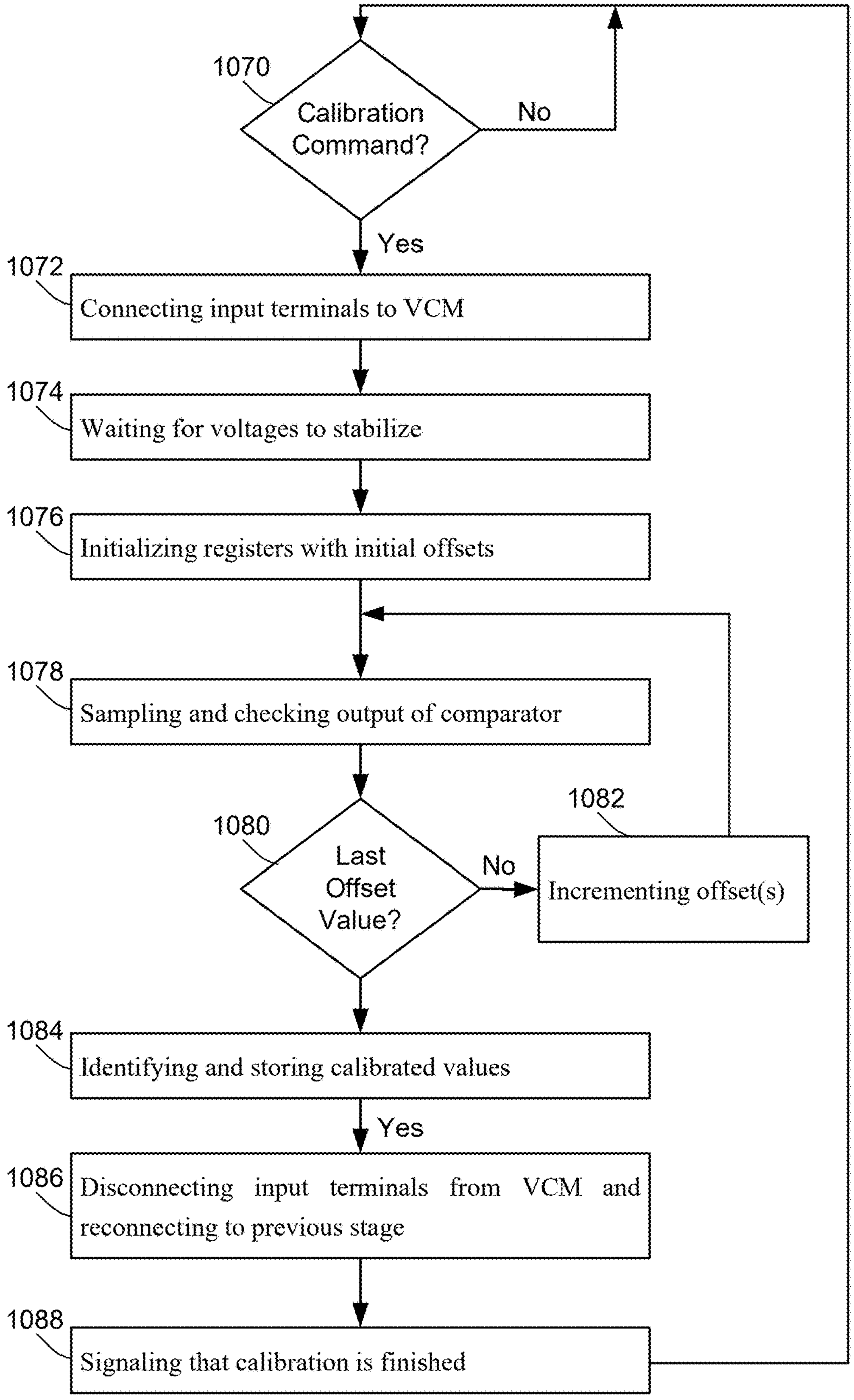
FIG. 10 illustrates an example of a calibration operation.

FIG. 10 illustrates an example of a method of calibrating that may be implemented by suitable calibration circuits (e.g., FSM 926 and registers 928). The method includes determining if a calibration command has been received 1070 and, in response to determining that a calibration command has been received, connecting input terminals of the comparator to common-mode voltage (VCM) 1072, waiting for voltages to stabilize 1074 and initiating registers with initial offsets 1076. The method further includes sampling and checking output of the comparator 1078 (e.g., to check the distribution of logical bits between logic 0 and logic 1), making a determination 1080 as to whether the current offset value is the last offset value (e.g., in a predetermined list of offset values to be applied) and if the current offset value is not the last offset value, incrementing the offset(s) 1082. Sampling and checking are repeated for different offset values until the last offset value is reached. The method further includes, in response to a determination 1080 that the current offset value is the last offset value, identifying and storing calibrated values 1084 (e.g., storing first and second offsets in registers 928), disconnecting input terminals from VCM and reconnecting to the previous stage 1086 and signaling that calibration is finished 1088. The calibration circuit then returns to waiting for a calibration command.

Figure 11A:
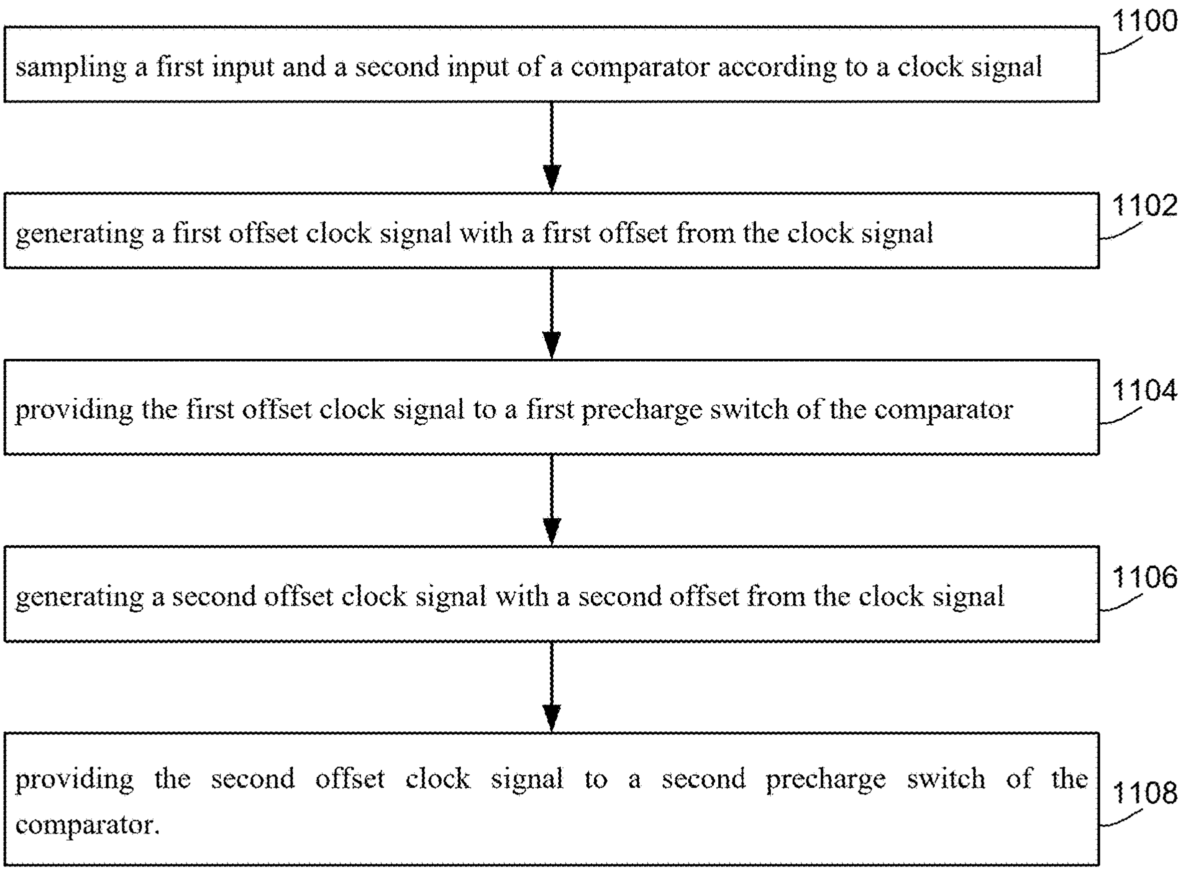
FIGS. 11A-B illustrate methods according to aspects of the present technology.

FIG. 11A shows an example of a method that includes sampling a first input and a second input of a comparator according to a clock signal 1100 (e.g., sampling at input terminals 630 and 632 according to CLK_t), generating a first offset clock signal with a first offset from the clock signal 1102 (e.g., CLK_L), providing the first offset clock signal to a first precharge switch of the comparator 1104 (e.g., to M9 and/or M10), generating a second offset clock signal with a second offset from the clock signal 1106 (e.g., CLK_R) and providing the second offset clock signal to a second precharge switch of the comparator 1108 (e.g., to M8 and/or M14).

Figure 11B:
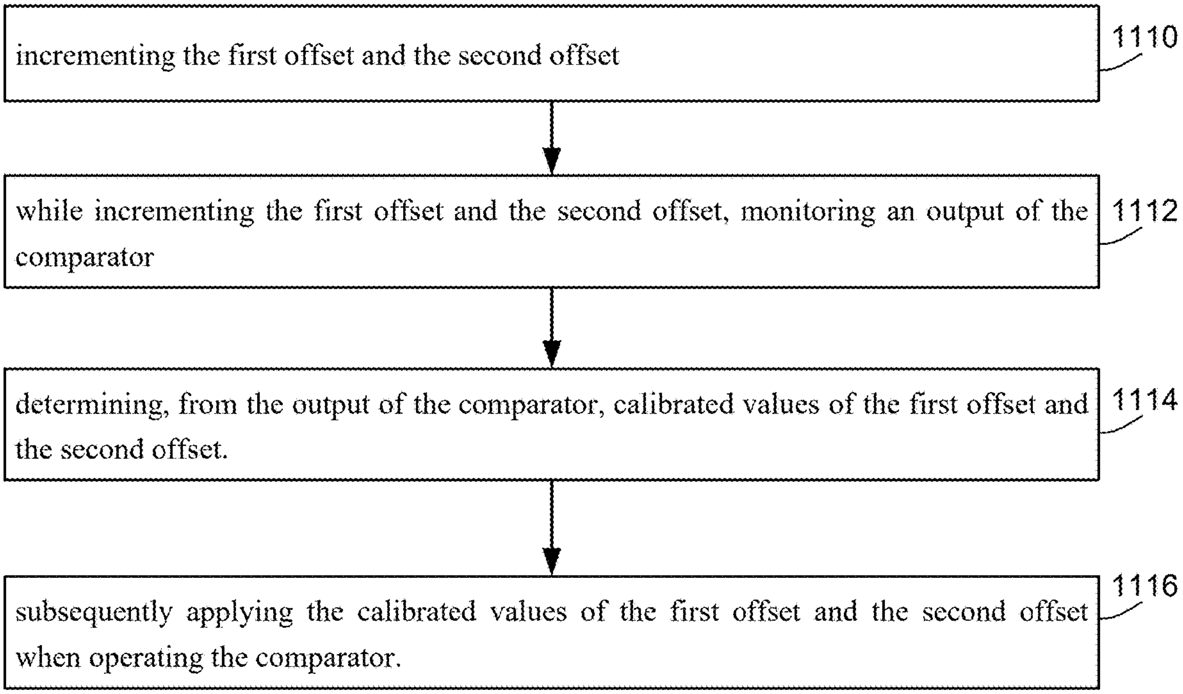

FIG. 11B shows a method of calibration (e.g., to find first and second offsets) that includes incrementing the first offset and the second offset 1110, while incrementing the first offset and the second offset, monitoring an output of the comparator 1112 (e.g., distribution of bits of output), determining, from the output of the comparator, calibrated values of the first offset and the second offset 1114 (e.g., offsets that provide substantially equal distribution of bits between logic 0 and logic 1), and subsequently applying the calibrated values of the first offset and the second offset when operating the comparator 1116 (e.g., storing the calibrated values of the first offset and the second offset in a set of registers configured to control the first offset clock signal and the second offset clock signal).

Figure 12:
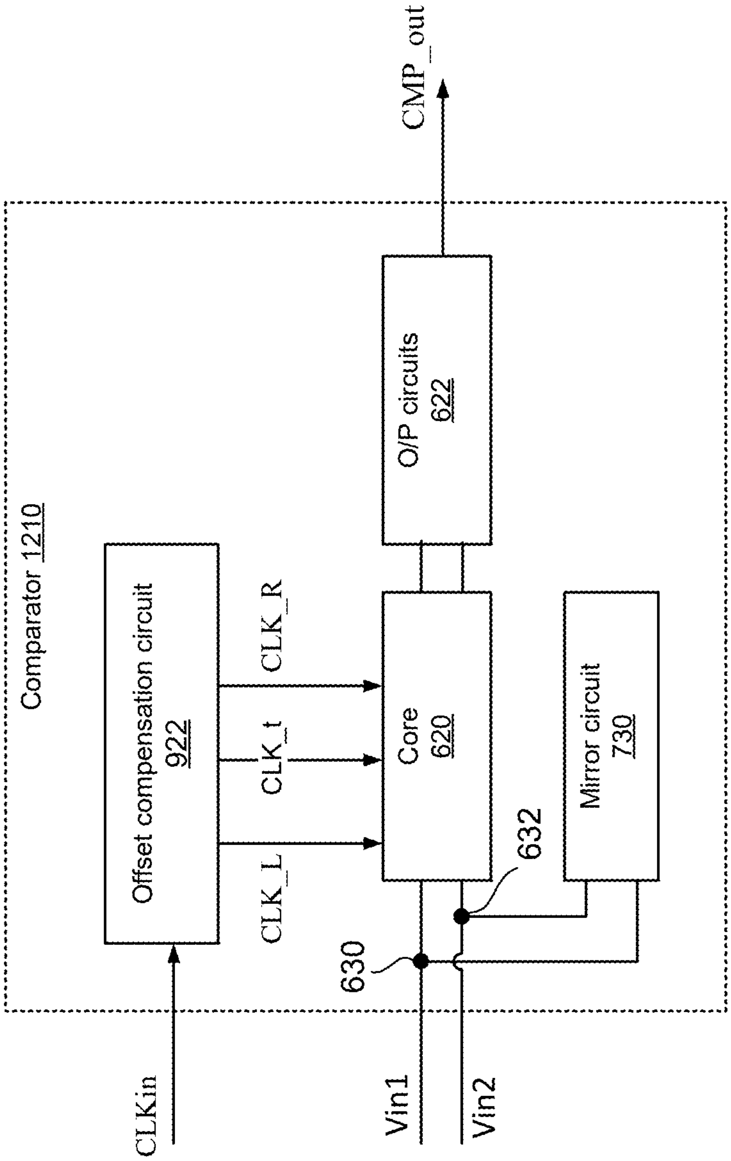
FIG. 12 illustrates an example of a comparator that includes a mirror circuit and offset compensation circuit.

While aspects of the present technology may be implemented separately, in some examples, multiple aspects may be implemented together and the present technology is not limited to the examples above. FIG. 12 shows an example of a comparator 1210 that includes mirror circuit 730 connected to input terminals 630 and 632 to reduce or eliminate kickback noise from core 620 and includes offset compensation circuit 922 to reduce or eliminate input referred offset.

According to a first set of aspects, an apparatus includes a comparator core configured to compare a first voltage received at a first terminal with a second voltage received at a second terminal at sample times determined by a first clock signal. The comparator core further includes a mirror circuit connected to the first terminal and the second terminal, the mirror circuit driven by a second clock signal that is in anti-phase with the first clock signal.

In one or more example of the above apparatus, the comparator core includes a first transistor and a second transistor connected to form a first differential pair, the first transistor having a gate connected to the first terminal and the second transistor having a gate connected to the second terminal.

In one or more example of the above apparatus, the mirror circuit includes a first mirror transistor and a second mirror transistor connected to form a second differential pair, the first mirror transistor having a gate connected to the first terminal and the second mirror transistor having a gate connected to the second terminal.

In one or more example of the above apparatus, the first differential pair is connected in series with a third transistor that is driven by the first clock signal and the second differential pair is connected in series with a third mirror transistor that is driven by the second clock signal.

In one or more example of the above apparatus, the first mirror transistor and the second mirror transistor are connected in parallel between ground and a first terminal of the third mirror transistor and a second terminal of the third mirror transistor is connected to ground.

In one or more example of the above apparatus, the first transistor and the second transistor are identical, the first mirror transistor and the second mirror transistor are identical, the first and second mirror transistors having smaller dimensions than the first and second transistors.

In one or more example of the above apparatus, the comparator core is a Strong-Arm core that includes a first clocked differential pair with timing determined by the first clock signal and the mirror circuit includes a second clocked differential pair with timing determined by the second clock signal.

In one or more example of the above apparatus, the second clocked differential pair is formed by a first mirror transistor connected in parallel with a second mirror transistor, the first mirror transistor having a drain connected to ground, a source connected to a drain of a third mirror transistor and a gate connected to the first terminal, the second mirror transistor having a drain connected to ground, a source connected to the drain of the third mirror transistor and a gate connected to the second terminal, the third mirror transistor having a drain connected to sources of the first and second mirror transistors, a source connected to ground and a gate connected to the second clock signal.

In one or more example, the apparatus further includes an output circuit connected to an output of the comparator core, the output circuit including a latch for holding comparison data from the comparator core.

In one or more example, the apparatus further includes an offset compensation circuit configured to generate a first offset clock signal that is offset from the first clock signal by a first offset and generate a second offset clock signal that is offset from the first clock signal by a second offset, the first offset clock signal provided at a first precharge switch of the comparator core and the second offset clock signal provided at a second precharge switch of the comparator core.

In one or more example, the apparatus further includes a finite state machine configured to perform a calibration operation to obtain a first calibrated value and a second calibrated value for the first offset and the second offset respectively; and a set of registers to store the first calibrated value for the first offset and store the second calibrated value for the second offset clock signal.

According to another set of aspects, a method includes sampling a first input and a second input of a comparator according to a clock signal; generating a first offset clock signal with a first offset from the clock signal; providing the first offset clock signal to a first precharge switch of the comparator; generating a second offset clock signal with a second offset from the clock signal; and providing the second offset clock signal to a second precharge switch of the comparator.

In one or more example, the method further includes incrementing the first offset and the second offset; while incrementing the first offset and the second offset, monitoring an output of the comparator; and determining calibrated values of the first offset and the second offset from the output of the comparator.

In one or more example, the method further includes subsequently applying the calibrated values of the first offset and the second offset when operating the comparator.

In one or more example, the method further includes storing the calibrated values of the first offset and the second offset in a set of registers configured to control the first offset clock signal and the second offset clock signal.

In one or more example, the method further includes applying a second clock signal that is in anti-phase with the clock signal to a mirror circuit coupled to the first input and the second input.

In one or more example, the method further includes generating, in the mirror circuit, a voltage that is opposite in polarity to a kickback voltage generated by the comparator.

In another set of aspects, a system includes a comparator core configured to compare a first voltage received at a first terminal with a second voltage received at a second terminal at sample times determined by a first clock signal; and means for generating voltage pulses at the first and second terminals according to a second clock signal that is in anti-phase with the first clock signal such that the voltage pulses are opposite in polarity to kickback pulses of the comparator core.

In one or more example, the system further includes an offset compensation circuit configured to generate a first offset clock signal that is offset from the first clock signal by a first offset and generate a second offset clock signal that is offset from the first clock signal by a second offset.

In one or more example, the system further includes the offset compensation circuit includes a logic circuit configured to perform a calibration operation to obtain first and second calibrated values for the first and second offsets and a set of registers to store the first and second calibrated values.

The foregoing detailed description has been presented for purposes of illustration and description. It is not intended to be exhaustive or to limit the invention to the precise form disclosed. Many modifications and variations are possible in light of the above teachings. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. An apparatus, comprising:

a comparator core configured to compare a first voltage received at a first terminal with a second voltage received at a second terminal at sample times determined by a first clock signal; and a mirror circuit that includes a first mirror transistor having a gate connected to the first terminal and a second mirror transistor having a gate connected to the second terminal to form a mirror differential pair, the mirror differential pair is connected in series with a third mirror transistor that is driven by a second clock signal that is in anti-phase with the first clock signal, the first mirror transistor and the second mirror transistor are connected in parallel between ground and a first terminal of the third mirror transistor and a second terminal of the third mirror transistor is connected to ground.

2. The apparatus of claim 1, wherein the comparator core includes a first transistor and a second transistor connected to form a first differential pair, the first transistor having a gate connected to the first terminal and the second transistor having a gate connected to the second terminal.

3. The apparatus of claim 2, wherein the first differential pair is connected in series with a third transistor that is driven by the first clock signal.

4. The apparatus of claim 2, wherein the first transistor and the second transistor are identical, the first mirror transistor and the second mirror transistor are identical, the first and second mirror transistors having smaller dimensions than the first and second transistors.

5. The apparatus of claim 1, wherein the comparator core is a Strong-Arm core.

6. The apparatus of claim 1, wherein the first mirror transistor has a drain connected to ground, a source connected to a drain of the third mirror transistor and a gate connected to the first terminal, the second mirror transistor has a drain connected to ground, a source connected to the drain of the third mirror transistor and a gate connected to the second terminal, the third mirror transistor has a drain connected to sources of the first and second mirror transistors, a source connected to ground and a gate connected to the second clock signal.

7. The apparatus of claim 1, further comprising an output circuit connected to an output of the comparator core, the output circuit including a latch for holding comparison data from the comparator core.

8. The apparatus of claim 1, further comprising an offset compensation circuit configured to generate a first offset clock signal that is offset from the first clock signal by a first offset and generate a second offset clock signal that is offset from the first clock signal by a second offset, the first offset clock signal provided at a first precharge switch of the comparator core and the second offset clock signal provided at a second precharge switch of the comparator core.

9. The apparatus of claim 8, further comprising:

a finite state machine configured to perform a calibration operation to obtain a first calibrated value and a second calibrated value for the first offset and the second offset respectively; and a set of registers to store the first calibrated value for the first offset and store the second calibrated value for the second offset clock signal.

10. The apparatus of claim 1, wherein the comparator core and the mirror circuit are located in interface circuits of a memory die that includes nonvolatile memory cells.

11. The apparatus of claim 10, wherein the first terminal and the second terminal are connected to a bus that connects the memory die to a memory controller.

12. The apparatus of claim 1, wherein the comparator core and the mirror circuit are located in interface circuits of a memory controller die that is connected to one or more memory dies.

13. A method comprising:

sampling a first input and a second input of a comparator according to a first clock signal;

applying a second clock signal that is in anti-phase with the first clock signal to a mirror circuit that includes a first mirror transistor having a gate connected to the first input and a second mirror transistor having a gate connected to the second input to form a differential pair, the differential pair is connected in series with a third mirror transistor having a gate connected to the second clock signal, the first mirror transistor and the second mirror transistor are connected in parallel between ground and a first terminal of the third mirror transistor and a second terminal of the third mirror transistor is connected to ground;

generating, in the mirror circuit, a voltage that is opposite in polarity to a kickback voltage generated by the comparator at the first and second inputs of the comparator;

generating a first offset clock signal with a first offset from the clock signal;

providing the first offset clock signal to a first precharge switch of the comparator;

generating a second offset clock signal with a second offset from the clock signal; and providing the second offset clock signal to a second precharge switch of the comparator.

14. The method of claim 13, further comprising:

incrementing the first offset and the second offset;

while incrementing the first offset and the second offset, monitoring an output of the comparator; and determining calibrated values of the first offset and the second offset from the output of the comparator.

15. The method of claim 14, further comprising:

subsequently applying the calibrated values of the first offset and the second offset when operating the comparator.

16. The method of claim 15, further comprising:

storing the calibrated values of the first offset and the second offset in a set of registers configured to control the first offset clock signal and the second offset clock signal.

17. A system comprising:

means for comparing a first voltage received at a first terminal with a second voltage received at a second terminal at sample times determined by a first clock signal; and a mirror circuit configured to generate voltage pulses at the first and second terminals according to a second clock signal that is in anti-phase with the first clock signal such that the voltage pulses are opposite in polarity to kickback pulses of the means for comparing, the mirror circuit including a first mirror transistor having a gate connected to the first terminal and a second mirror transistor having a gate connected to the second terminal to form a mirror differential pair, the first mirror transistor and the second mirror transistor are connected in parallel between ground and a first terminal of a third mirror transistor and a second terminal of the third mirror transistor is connected to ground.

18. The system of claim 17, further comprising an offset compensation circuit configured to generate a first offset clock signal that is offset from the first clock signal by a first offset and generate a second offset clock signal that is offset from the first clock signal by a second offset.

19. The system of claim 18, wherein the offset compensation circuit includes a logic circuit configured to perform a calibration operation to obtain first and second calibrated values for the first and second offsets and a set of registers to store the first and second calibrated values.

* * * * *